United States Patent
Schlosser et al.

(10) Patent No.: US 8,599,047 B2
(45) Date of Patent: *Dec. 3, 2013

(54) HAPTIC KEYBOARD ASSEMBLIES AND METHODS

(75) Inventors: James William Schlosser, Spokane, WA (US); Cody George Peterson, Coeur d'Alene, ID (US); Andrew Huska, Post Falls, ID (US)

(73) Assignee: Synaptics Incorporated, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/458,746

(22) Filed: Apr. 27, 2012

(65) Prior Publication Data

US 2013/0180839 A1   Jul. 18, 2013

Related U.S. Application Data

(63) Continuation of application No. 12/791,630, filed on Jun. 1, 2010, now Pat. No. 8,248,278, which is a continuation of application No. 11/945,879, filed on Nov. 27, 2007, now Pat. No. 7,741,979.

(60) Provisional application No. 60/948,377, filed on Jul. 6, 2007.

(51) Int. Cl.
 *H03K 17/94* (2006.01)

(52) U.S. Cl.
 USPC ............. 341/27; 345/157; 84/615; 84/653

(58) Field of Classification Search
 USPC .......... 341/21–34; 345/156, 157; 84/615, 653
 See application file for complete search history.

(56) References Cited

U.S. PATENT DOCUMENTS

| | | | |
|---|---|---|---|
| 4,200,778 | A | 4/1980 | Bovio et al. |
| 4,529,849 | A | 7/1985 | Kamei et al. |
| 5,057,657 | A | 10/1991 | Skulic |
| 5,149,923 | A | 9/1992 | Demeo |
| 5,239,152 | A | 8/1993 | Caldwell et al. |
| 5,612,692 | A | 3/1997 | Dugas et al. |
| 5,676,476 | A | 10/1997 | Uke |
| 5,729,222 | A | 3/1998 | Iggulden et al. |
| 5,943,233 | A | 8/1999 | Ebina et al. |

(Continued)

FOREIGN PATENT DOCUMENTS

| | | |
|---|---|---|
| DE | 19704253 A | 8/1998 |
| DE | 10126670 A1 | 12/2002 |

(Continued)

OTHER PUBLICATIONS

"Elastomers: Powerful Polymer", Retrieved from <http://appliancedesign.com/copyright/>, (Jun. 2006),5 pages.

(Continued)

*Primary Examiner* — David S. Warren
(74) *Attorney, Agent, or Firm* — Ingrassia Fisher & Lorenz P.C.

(57) ABSTRACT

Various embodiments provide keyboards that provide haptic feedback to a user of the keyboard. In at least some embodiments, movement of an actuator and/or a user-engageable portion in a direction generally orthogonal to a direction of the keypress when the switch is closed provides a user with haptic feedback, which simulates a snapover movement.

18 Claims, 8 Drawing Sheets

(56) References Cited

U.S. PATENT DOCUMENTS

| | | | |
|---|---|---|---|
| 6,003,390 A | 12/1999 | Cousy | |
| 6,218,966 B1 | 4/2001 | Goodwin et al. | |
| 6,429,846 B2 | 8/2002 | Rosenberg et al. | |
| 6,684,166 B2 | 1/2004 | Bellwood et al. | |
| 6,791,480 B1 | 9/2004 | Uke | |
| 7,166,795 B2 | 1/2007 | Lengeling | |
| 7,182,691 B1 | 2/2007 | Schena | |
| 7,196,688 B2 | 3/2007 | Schena | |
| 7,339,572 B2 | 3/2008 | Schena | |
| 7,342,573 B2 | 3/2008 | Ryynaenen | |
| 7,364,337 B2 | 4/2008 | Park | |
| 7,592,999 B2 | 9/2009 | Rosenberg et al. | |
| 7,741,979 B2 | 6/2010 | Schlosser et al. | |
| 7,791,588 B2 | 9/2010 | Tierling et al. | |
| 7,834,857 B2* | 11/2010 | Prados | 345/173 |
| 7,969,288 B2 | 6/2011 | Braun et al. | |
| 7,982,720 B2 | 7/2011 | Rosenberg et al. | |
| 8,031,181 B2 | 10/2011 | Rosenberg et al. | |
| 8,059,105 B2 | 11/2011 | Rosenberg et al. | |
| 8,199,033 B2 | 6/2012 | Peterson et al. | |
| 8,203,531 B2 | 6/2012 | Peterson et al. | |
| 8,248,277 B2 | 8/2012 | Peterson et al. | |
| 8,248,278 B2 | 8/2012 | Schlosser et al. | |
| 8,263,887 B2 | 9/2012 | Chen et al. | |
| 2002/0054060 A1 | 5/2002 | Schena | |
| 2002/0149561 A1 | 10/2002 | Fukumoto et al. | |
| 2003/0208324 A1 | 11/2003 | Bellwood et al. | |
| 2003/0209131 A1 | 11/2003 | Asahi | |
| 2004/0031673 A1 | 2/2004 | Levy | |
| 2004/0085716 A1 | 5/2004 | Uke | |
| 2004/0130526 A1 | 7/2004 | Rosenberg | |
| 2004/0252104 A1 | 12/2004 | Nakamura et al. | |
| 2005/0017947 A1 | 1/2005 | Shahoian et al. | |
| 2005/0029437 A1* | 2/2005 | Hasegawa et al. | 250/226 |
| 2005/0052430 A1* | 3/2005 | Shahoian et al. | 345/173 |
| 2005/0134561 A1 | 6/2005 | Tierling et al. | |
| 2005/0157893 A1 | 7/2005 | Pelrine et al. | |
| 2005/0184959 A1* | 8/2005 | Kompe et al. | 345/163 |
| 2005/0204906 A1 | 9/2005 | Lengeling | |
| 2005/0237309 A1 | 10/2005 | Sharma | |
| 2006/0146036 A1* | 7/2006 | Prados et al. | 345/173 |
| 2006/0187201 A1 | 8/2006 | Rosenberg et al. | |
| 2006/0256075 A1 | 11/2006 | Anastas et al. | |
| 2006/0261983 A1 | 11/2006 | Griffin et al. | |
| 2006/0267949 A1 | 11/2006 | Rosenberg | |
| 2006/0279538 A1 | 12/2006 | Chang et al. | |
| 2006/0290662 A1 | 12/2006 | Houston et al. | |
| 2007/0047051 A1* | 3/2007 | Selbrede et al. | 359/230 |
| 2007/0065215 A1 | 3/2007 | Brown | |
| 2007/0091070 A1 | 4/2007 | Larsen et al. | |
| 2007/0139359 A1* | 6/2007 | Voelckers | 345/156 |
| 2007/0146317 A1 | 6/2007 | Schena | |
| 2007/0152974 A1 | 7/2007 | Kim et al. | |
| 2007/0193436 A1 | 8/2007 | Chu | |
| 2007/0203011 A1* | 8/2007 | Gudgel et al. | 501/2 |
| 2007/0216643 A1* | 9/2007 | Morris et al. | 345/156 |
| 2007/0234887 A1 | 10/2007 | Sawada et al. | |
| 2007/0234890 A1 | 10/2007 | Yamashita | |
| 2007/0236449 A1 | 10/2007 | Lacroix | |
| 2007/0236450 A1* | 10/2007 | Colgate et al. | 345/156 |
| 2007/0251810 A1 | 11/2007 | Corcoran et al. | |
| 2007/0285284 A1 | 12/2007 | Matteo et al. | |
| 2008/0010593 A1 | 1/2008 | Uusitalo et al. | |
| 2008/0042978 A1 | 2/2008 | Perez-Noguera | |
| 2008/0060856 A1* | 3/2008 | Shahoian et al. | 178/18.03 |
| 2008/0062144 A1* | 3/2008 | Shahoian et al. | 345/173 |
| 2008/0062145 A1* | 3/2008 | Shahoian et al. | 345/173 |
| 2008/0083314 A1 | 4/2008 | Hayashi et al. | |
| 2008/0084384 A1 | 4/2008 | Gregorio et al. | |
| 2008/0092087 A1 | 4/2008 | Brown et al. | |
| 2008/0092720 A1 | 4/2008 | Yamashita et al. | |
| 2008/0158637 A1* | 7/2008 | Van Ostrand | 359/230 |
| 2008/0174889 A1* | 7/2008 | Su et al. | 359/824 |
| 2008/0197901 A1 | 8/2008 | Cruz-Hernandez et al. | |
| 2008/0198139 A1* | 8/2008 | Lacroix et al. | 345/173 |
| 2008/0212158 A1* | 9/2008 | Van Ostrand | 359/230 |
| 2008/0223706 A1 | 9/2008 | Hagiwara et al. | |
| 2008/0251364 A1 | 10/2008 | Takala et al. | |
| 2008/0289952 A1 | 11/2008 | Pelrine et al. | |
| 2008/0303782 A1 | 12/2008 | Grant et al. | |
| 2009/0002199 A1 | 1/2009 | Lainonen et al. | |
| 2009/0002205 A1 | 1/2009 | Klinghult et al. | |
| 2009/0007758 A1* | 1/2009 | Schlosser et al. | 84/436 |
| 2009/0008234 A1 | 1/2009 | Tolbert et al. | |
| 2009/0072662 A1 | 3/2009 | Sadler et al. | |
| 2009/0085878 A1* | 4/2009 | Heubel et al. | 345/173 |
| 2009/0085882 A1* | 4/2009 | Grant et al. | 345/173 |
| 2009/0106655 A1* | 4/2009 | Grant et al. | 715/702 |
| 2009/0128368 A1 | 5/2009 | Chen et al. | |
| 2009/0135142 A1* | 5/2009 | Fu et al. | 345/168 |
| 2009/0160763 A1* | 6/2009 | Cauwels et al. | 345/156 |
| 2009/0167704 A1* | 7/2009 | Terlizzi et al. | 345/173 |
| 2009/0174672 A1* | 7/2009 | Schmidt | 345/173 |
| 2009/0178913 A1* | 7/2009 | Peterson et al. | 200/5 A |
| 2009/0188374 A1 | 7/2009 | Folkesson | |
| 2009/0189790 A1* | 7/2009 | Peterson et al. | 341/22 |
| 2009/0189873 A1* | 7/2009 | Peterson et al. | 345/173 |
| 2009/0210568 A1* | 8/2009 | Peterson et al. | 710/15 |
| 2009/0219252 A1* | 9/2009 | Jarventie et al. | 345/173 |
| 2009/0231113 A1 | 9/2009 | Olien et al. | |
| 2009/0231271 A1* | 9/2009 | Heubel et al. | 345/156 |
| 2009/0231277 A1* | 9/2009 | Peterson et al. | 345/157 |
| 2009/0244017 A1* | 10/2009 | Pala et al. | 345/173 |
| 2009/0267920 A1* | 10/2009 | Faubert et al. | 345/177 |
| 2009/0267921 A1 | 10/2009 | Pryor | |
| 2009/0303022 A1* | 12/2009 | Griffin et al. | 340/407.2 |
| 2009/0303187 A1 | 12/2009 | Pallakoff | |
| 2010/0045612 A1 | 2/2010 | Moelne | |
| 2010/0108408 A1* | 5/2010 | Colgate et al. | 178/18.03 |
| 2010/0128002 A1* | 5/2010 | Stacy et al. | 345/174 |
| 2010/0130280 A1* | 5/2010 | Arezina et al. | 463/20 |
| 2010/0156801 A1 | 6/2010 | Yurochko | |
| 2010/0160016 A1* | 6/2010 | Shimabukuro et al. | 463/16 |
| 2010/0171715 A1* | 7/2010 | Peterson et al. | 345/173 |
| 2010/0177050 A1 | 7/2010 | Heubel et al. | |
| 2010/0295792 A1 | 11/2010 | Saarikko et al. | |
| 2010/0302169 A1 | 12/2010 | Pance et al. | |
| 2010/0314396 A1 | 12/2010 | Zieger | |
| 2011/0073454 A1 | 3/2011 | Chen et al. | |
| 2011/0094868 A1 | 4/2011 | Lamers et al. | |
| 2011/0102326 A1 | 5/2011 | Casparian et al. | |
| 2011/0107958 A1 | 5/2011 | Pance et al. | |
| 2011/0148607 A1 | 6/2011 | Zeleny | |
| 2011/0227763 A1 | 9/2011 | Schlosser et al. | |
| 2012/0020045 A1 | 1/2012 | Tanase | |
| 2012/0139843 A1 | 6/2012 | Shipman et al. | |
| 2012/0166696 A1 | 6/2012 | Kallio et al. | |

FOREIGN PATENT DOCUMENTS

| | | |
|---|---|---|
| DE | 2005002417 A | 4/2005 |
| DE | 2004005501 A | 8/2005 |
| EP | 0654727 A | 5/1995 |
| EP | 1310860 A | 5/2003 |
| EP | 1548776 A | 6/2005 |
| JP | 61000825 A | 1/1986 |
| WO | 0191100 A1 | 11/2001 |
| WO | 2009043605 A1 | 4/2009 |
| WO | 2009097358 A1 | 8/2009 |
| WO | 2009097359 A | 8/2009 |
| WO | 2009097361 A | 8/2009 |
| WO | 2009114827 A | 9/2009 |

OTHER PUBLICATIONS

"Final Office Action mailed Nov. 8, 2011", U.S. Appl. No. 12/360,265, 11 pages.
"Final Office Action mailed Nov. 22, 2011", U.S. Appl. No. 12/371,301, 6 pages.
"Haptic Touch Technology", Pacinian,(Nov. 2007),2 pages.
"Haptics: Learning Through Touch", Retrieved from <http://ced.ncsu.edu/nanoscale/haptics.htm>, (2004),5 pages.
"International Search Report and Written Opinion", Application No. PCT/US2009/032289, (Dec. 23, 2009), 10 pages.

(56) References Cited

OTHER PUBLICATIONS

"International Search Report and Written Opinion", Application No. PCT/US2010/020380, (Apr. 12, 2010),10 pages.
"International Search Report and Written Opinion", Application Serial No. PCT/US2009/032288, (Apr. 29, 2009), 10 pages.
"International Search Report and Written Opinion", Application Serial No. PCT/US2009/032292, (Aug. 11, 2009), 14 pages.
"International Search Report and Written Opinion", Application Serial No. PCT/US2009/037191, (May 28, 2009), 11 pages.
"Nanoactuators Based on Electrostatic Forces on Dielectrics", Retrieved from <http://www.nasatech.com/Briefs/Apr05/NPO30747.html>on Nov. 28, 2005, NASA's Jet Propulsion Laboratory, Pasadena, CA,4 pages.
"New SRI International sSpin-Off, Artificial Muscle, Inc., Secure Series a Funding from Leading VC Firms", Retrieved from <http://www.sri.com/news/releases/05-03-04.html> on Jan. 30, 2008, SRI International Spin Offs Artificial Muscle, Inc,(May 2004),2 pages.
"Non-Final Office Action mailed Oct. 13, 2011", U.S. Appl. No. 12/791,630, 5 pages.
"Non-Final Office Action mailed Dec. 14, 2010", U.S. Appl. No. 12/360,316, 7 pages.
"Non-Final Office Action Mailed Feb. 1, 2012", U.S. Appl. No. 12/360,631, 7 pages.
"Non-Final Office Action mailed Feb. 13, 2009", U.S. Appl. No. 11/945,879, 7 pages.
"Non-Final Office Action mailed Apr. 1, 2011", U.S. Appl. No. 12/371,301, 4 pages.
"Non-Final Office Action mailed May 12, 2011", U.S. Appl. No. 12/360,265, 7 pages.
"Non-Final Office Action mailed Jul. 9, 2009", U.S. Appl. No. 11/945,879, 10 pages.
"Non-Final Office Action mailed Sep. 1, 2011", U.S. Appl. No. 12/403,270, 5 pages.
"Notice of Allowance and Fees Due" mailed Jan. 24, 2012, U.S. Appl. No. 12/791,630, 7 pages.
"Notice of Allowance and Fees Due" mailed Jan. 30, 2012, U.S. Appl. No. 12/360,316, 8 pages.
"Notice of Allowance and Fees Due" mailed Feb. 21, 2012, U.S. Appl. No. 12/403,270, 5 pages.
"Notice of Allowance mailed Oct. 3, 2011", U.S. Appl. No. 12/360,316, 4 pages.
"Notice of Allowance mailed Feb. 23, 2010", U.S. Appl. No. 11/945,879, 6 pages.
"Proposed Experiment Protocol and Details", Retrieved from <http://bdml.stanford.edu/twiki/bin/view/Haptics/ProposedExperi0mentPr- otocolAndDetails>, 5 pages.
"Supplemental Notice of Allowance mailed May 20, 2010", U.S. Appl. No. 11/945,879, 5 pages.
"Tactile Perception and Design", Retrieved from <http:///www.tireesias.org/reports/tpd2.htm>, 10 pages.
"Touch and Haptics", 2004 IEEE/ RSJ International Conference on Intelligent Robots and Systems, (Sep. 28, 2004),32 pages.
"Touch-Hapsys", Retrieved from <http://www.touch-hapsys.org>, 2 pages.
Ashley, Steven "Artificial Muscles", Scientific American, Available at <www.sciam.com>,(Oct. 2003),pp. 53-59.
Bar-Cohen, Y. "Electroactive Polymer (EAP) Actuators as Artificial Muscles—Reality, Potential and Challenges", SPIE Press, (Mar. 18, 2004),pp. 26 and 548-550.
Bar-Cohen, Yoseph "Electric Flex", IEEE Spectrum Online, (Jun. 2004),6 pages.
Bar-Cohen, Yoseph "Electroactive Polymers as Artificial Muscles— Capabilities, Potentials and Challenges", Robotics 2000, Available at <www.spaceandrobotics>,(Feb. 28-Mar. 2, 2000),pp. 1-8.
Bar-Cohen, Yoseph "Electroactive Polymers", Retrieved from <http://electrochem.cwru.edu/ed/encycl/>, Electrochemistry Encyclopedia,(Dec. 2004),7 pages.
Bar-Cohen, Yoseph "Low Mass Muscle Actuators (LoMMAs)", Telerobotic Task Sponsored by NASA HQ, Code S, (Oct. 23, 1997),18 pages.

Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.
Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.
Bark, Karlin "Functional Prototype I", Retrieved from <http://bdml.stanford.edu/twiki/bin/view/Haptics/FunctionalPrototypeI?-skin=print.pattern>, (Aug. 9, 2005),3 pages.
Beavers, Alex "Basic Concepts for Commercial Applications of Electroactive Polymer Artificial Muscle", Artificial Muscle Incorporated, Menlo Park, CA,10 pages.
Bicchi, Antonio et al., "Haptic Illusions Induced by the Tactile Flow", Interdepartmental Research Centre "E. Piaggo", University of Pisa,12 pages.
Bifano, Thomas "Parallel Plate Electrostatic Actuation for High-Resolution Deformable Mirrors", Boston University, (Aug. 19, 2004),35 pages.
Biggs, James "Some Useful Information for Tactile Display Design", IEEE Transactions on Man-Machine Systems, vol. 11, No. 1,(1970),pp. 19-24.
Carpi, Federico et al., "Dielectric Elastomers as Electromechanical Transducers: Fundamentals, Materials, Devices, Models and Applications of an Emerging Elecrotactive Polymer Technology", Elsevier Ltd., (2008),12 pages.
Fontaine, Ebraheem "A Laboratory Demonstration of a Parallel Robotic Mechanism", Massachusetts Institute of Technology,(Jun. 2002),pp. 1-14.
Gorinevsky, Dimitry "Adaptive membrane for large lightweight space telescopes", SPIE Astronomical Telescopes and Instrumentation,(2002),pp. 1-9.
Hayward, Vincent et al., "Tactile Display Device Using Distributed Lateral Skin Stretch", Proceedings of the Haptic Interfaces for Virtual Environment and Teleoperator Systems Symposium, ASME International Mechanical Engineering Congress & Exposition,(2000),pp. 1309-1314.
Hollis, Ralph "Haptics", Berkshire Encyclopedia of Human-Computer Interaction, Berkshire Publishing Group,(2004), pp. 311-316.
Jager, Edwin et al., "Microfabricating Conjugated Polymer Actuators", Science Magazine, vol. 290, www.sciencemag.org,(Nov. 24, 2000),pp. 1540-1544.
Jones, Gail et al., "A Comparison of Learning with Haptic and Visual Modalities", National Science Foundation REC-0087389,pp. 1-20.
"Notice of Allowance and Fees Due" mailed Jul. 6, 2012, U.S. Appl. No. 12/360,631, 18 pages.
Jones, Lynette "Human Factors and Haptic Interfaces", Department of Mechanical Engineering, Massachusetts Institute of Technology,40 pages.
Kajimoto, Hiroyuki et al., "Electro-Tactile Display with Tactile Primary Color Approach", Graduate School of Information and Technology, The University of Tokyo,2 pages.
Mok Ha, Soon et al., "Interpenetrating Polymer Networks for High-Performance Electroelastomer Artificial Muscles", Department of Materials Science and Engineering, UCLA,pp. 1-19.
Notice of Allowance mailed Apr. 4, 2012, U.S. Appl. No. 12/360,265, 10 pages.
Odell, D.L. et al., "MicroRobot Conveyance and Propulsion System Using Comb Drive and Parallel Plate Actuators: The ScuttleBot", UC Berkley,4 pages.
O'Halloran, A et al., "Materials and Technologies for Artificial Muscle: A Review for the Mechatronic Muscle Project", Topics in Bio-Mechanical Engineering, Chapter 7, Department of Electronic Engineering, National University of Ireland Galway,(2004),pp. 184-215.
Pasquero, Jerome "Stimulation of the Fingertip by Lateral Skin Strech", Retrieved from <http://www.cim.mcgill.ca/.about.jay/index.sub.--files/research.htm>- ;, 5 pages.
Pasquero, Jerome "Stress: A Tactile Display Using Lateral Skin Stretch", Department of Electrical and Computer Engineering McGill University, Montreal,(Oct. 2003),75 pages.

(56) References Cited

OTHER PUBLICATIONS

Pasquero, Jerome "Survey on Communication Through Touch", Technical Report: TR-CIM 06.04, Center for Intelligent Machines Department of Electrical and Computer Engineering,(Jul. 2006),pp. 1-27.

Pasquero, Jerome "Tactile Display Survey", Technical Report TR-CIM 06.04,6 pages.

Pei, Qibing et al., "Multiple-Degrees-of-Freedom Electroelastomer Roll Actuators", SRI International Institute of Physics Publishing, (2004),pp. N86-N92.

Raisamo, Roope "Tactile User Interfaces", New Interaction Techniques,(Aug. 2, 2001),30 pages.

Seeger, Joseph et al., "Dynamics and Control of Parallel-Plate Actuators Beyond the Electrostatic Instability", Transducers "99 The 10th International Conference on Solid State Sensors and Actuators, (Jun. 1999),pp. 474-477.

Sommer-Larsen, Peter "Artificial Muscles", Rise National Laboratory, Condensed Matter Physics and Chemistry Department,3 pages.

Spires, Shelby "Artificial Strongman", Smart Business: For The New Economy, (Nov. 2000),1 page.

Srinivasan, Mandayam A., et al, "Role of Skin Biomechanics in Mechanoreceptor Response", Retrieved from <http://touchlab.mit.edu/oldresearch/currentwork/humanhaptics/roleofsk- inbiomechanics/> on Dec. 20, 2007, MIT Touch Lab, (Dec. 20, 2007),pp. 1-13.

Van De Mortel, Dirk "Exploration of Smart Materials for the Use of User-System Interaction", User System Interaction. Faculty Industrial Design. TU/e, (Apr. 2002),pp. 21-24.

Wagner, Christopher et al., "Integrating Tactile and Force Feedback with Finite Element Models", Division of Engineering and Applied Sciences, Harvard University,6 pages.

Wing, Alan et al., "Multidimensional Haptics Preliminary Report", Retrieved from <http://www.touch-hapsys.org>, (Sep. 21, 2003),pp. 1-125.

Wingert, Andreas et al., "On the Kinematics of Parallel Mechanisms with Bio-stable Polymer Actuators", Department of Mechanical Engineering, Massachusetts Institute of Technology Cambridge,8 pages.

Wu, Xingtao et al., "A generalized Capacitance-Based Model for Electrostatic Micro-Actuators", Department of Physics, New Jersey Institute of Technology, Newark, NJ, 07102-1982 Department of Mechanical Engineering, Columbia University, NY 10027,pp. 1-23.

Yang, Gi-Hun "Novel Haptic Mouse System for Holistic Haptic Display and Potential of Vibrotactile Stimulation", Human-Robot Interaction Reserach Center Korea Advanced Institute of Science and Technology,17 pages.

Zou, Jun et al., "Design of a Wide Tuning Range Micromachined Tunable Capacitor for Wireless Communications", Micro Actuators, Sensors, and Systems (MASS) Group Microelectronics Laboratory, University of Illinois, Urbana, IL 61801,6 pages.

"Notice of Allowance and Fees Due mailed Jun. 8, 2012", U.S. Appl. No. 12/371,301, 27 pages.

United States Patent and Trademark Office, U.S. Office Action dated Jan. 3, 2013 for U.S. Appl. No. 13/293,120.

* cited by examiner

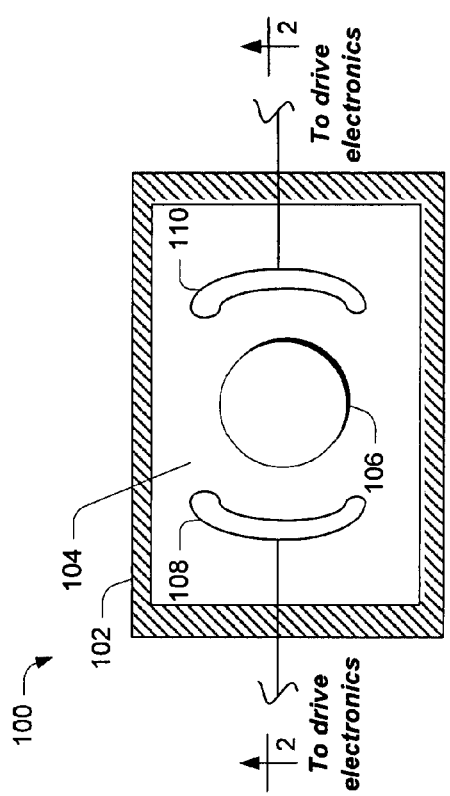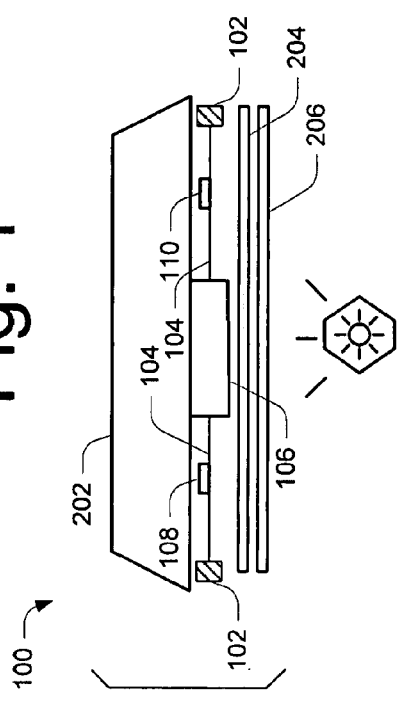

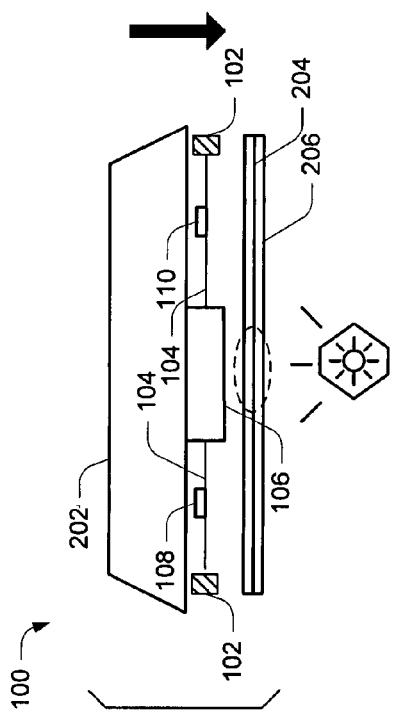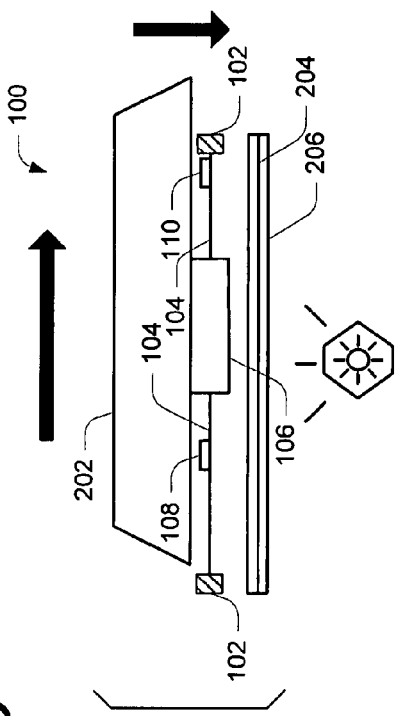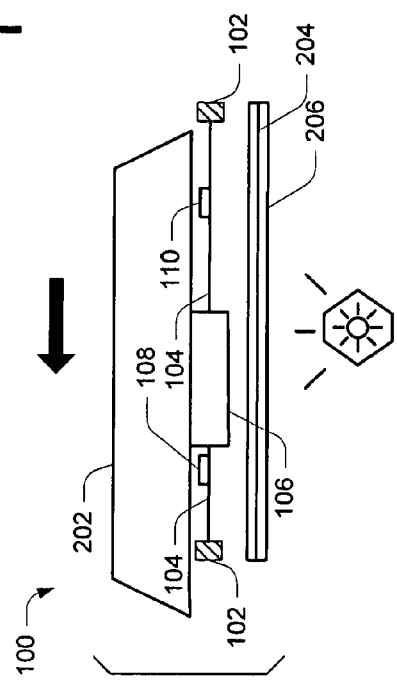

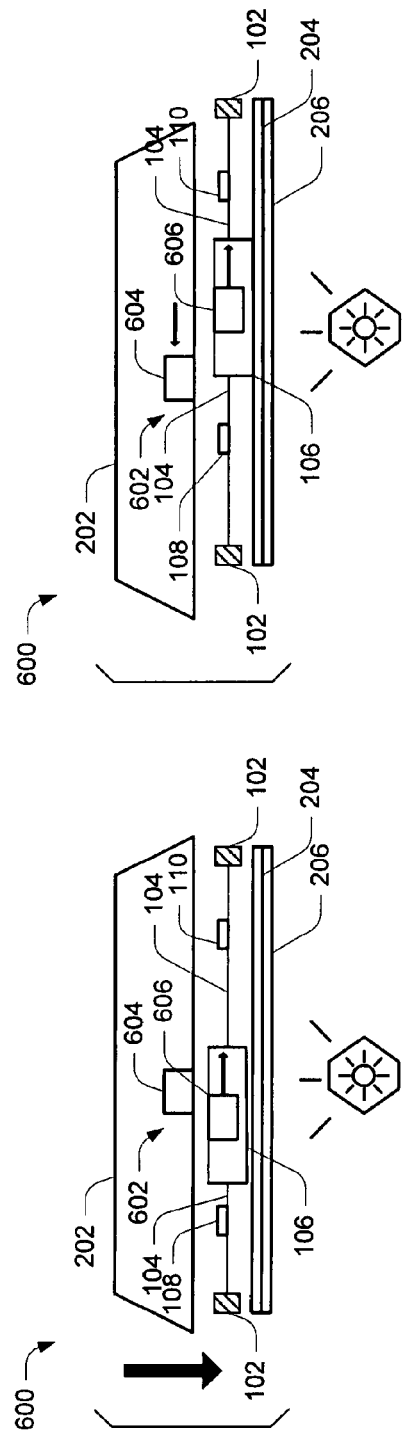
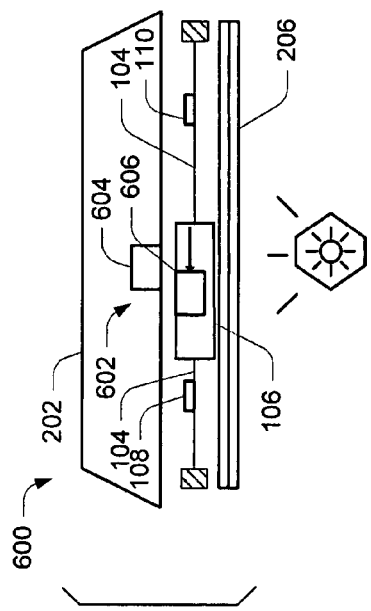
Fig. 6
Fig. 7
Fig. 8

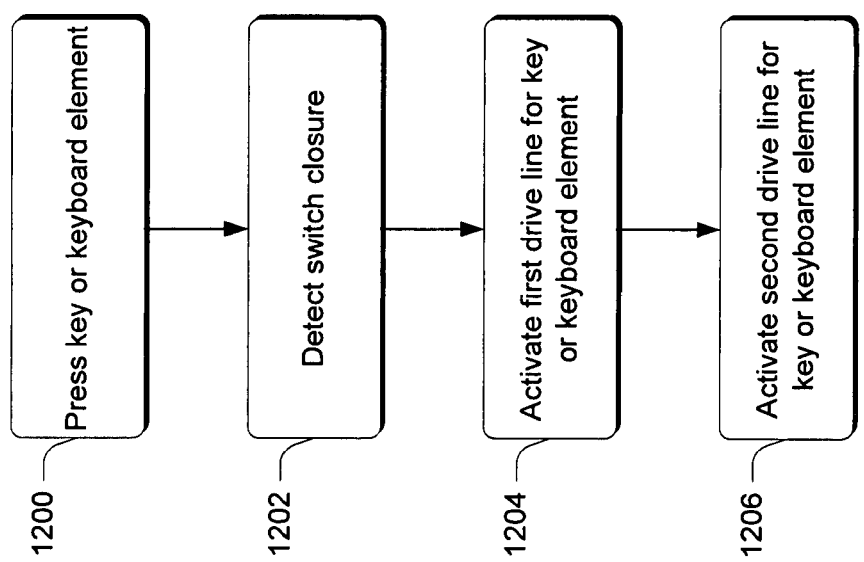

HAPTIC KEYBOARD ASSEMBLIES AND METHODS

RELATED APPLICATIONS

This application is a continuation of and claims priority to Ser. No. 12/791,630, filed on Jun. 1, 2010. Application Ser. No. 12/791,630 is a continuation of and claims priority to 11/945,879, filed Nov. 27, 2007. Application Ser. No. 11/945,879 claims priority to U.S. Provisional Application No. 60/948,377, filed on Jul. 6, 2007, the disclosure of which is incorporated by reference herein. Any disclaimer that may have occurred during the prosecution of these applications is hereby expressly rescinded, and reconsideration of all relevant art is respectfully requested.

BACKGROUND

Today, rapid typing keyboard technologies typically embody three primary attributes that are viewed as necessary or desirable for an effective implementation—low actuation force, significant travel distance, and tactile "snapover".

With regard to a low actuation force, studies have found that in order for a user to rapidly type, it is desirable to provide an overall key top actuation force from around between 40-80 grams. Having a light actuation force permits easy actuation and reduces fatigue.

With regard to travel distance, in order to rapidly type, many current technologies provide an overall travel distance (i.e. the vertical distance a key travels) from between 2-4 millimeters. In technologies that implement keyboards using elastomeric domes that are collapsible under pressure for key actuation, the travel distance is required because of the physical and mechanical nature of the domes that are employed. Specifically, the physical structure of the dome requires a longer travel distance in order to allow the dome geometry to adequately collapse, thus providing a response with tactile characteristics that are necessary or desirable for rapid typing. In addition, this travel distance is important because as a key top moves relative to a finger, frictional forces of this relative movement provide an additional tactile element (i.e. localized skin stretching) that plays an important role in a user's recognition of an electronic switch closure. The travel distances required by current dome technology significantly limit the form factor, e.g. the thickness of an associated keyboard. That is, keyboard thickness is significantly limited by the use of dome technology. This, in turn, reduces keyboard construction potentials and the various environments in which such keyboards can be used.

With regard to the tactile snapover, such is an important aspect for rapid typing. A snapover, as will be appreciated by the skilled artisan, creates a specific tactile response which is desirable in typing scenarios, particularly those that are rapid typing scenarios. The notion of snapover refers to a relationship between force and travel and is defined as a specific area on a standard keyboard force displacement curve. Snapover is what users typically associate with a valid electronic switch closure. In addition, this association between the tactile response and an electronic switch closure allows the user to learn to not rely solely on visual confirmation during typing, such as looking at the screen between each typed letter, to ensure that they are typing correctly. In current rubber dome technologies, this snapover is achieved due to the collapsing of the rubber dome. Typically, force exerted on the key and hence, on the rubber dome increases until the dome collapses and achieves switch closure. Due to the geometry and the physical characteristics of the rubber dome, achieving a snapover effect requires a sufficient amount of force and travel to reach the snapover point.

Against the backdrop, a need remains for keyboards that provide adequate user feedback and address the three attributes mentioned above.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Various embodiments provide keyboards that utilize an electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least some embodiments, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

BRIEF DESCRIPTION OF THE DRAWINGS

The same numbers are used throughout the drawings to reference like features.

FIG. 1 illustrates a top plan view of example key or keyboard element in accordance with one or more embodiments.

FIG. 2 illustrates the view of the FIG. 1 key or keyboard element, taken along line 2-2 in FIG. 1.

FIG. 3 illustrates a key or keyboard element in accordance with one or more embodiments.

FIG. 4 illustrates a key or keyboard element in accordance with one or more embodiments.

FIG. 5 illustrates a key or keyboard element in accordance with one or more embodiments.

FIG. 6 illustrates a key or keyboard element in accordance with one or more embodiments.

FIG. 7 illustrates a key or keyboard element in accordance with one or more embodiments.

FIG. 8 illustrates a key or keyboard element in accordance with one or more embodiments.

FIG. 12 is a flow diagram that describes steps in a method in accordance with one or more embodiments.

DETAILED DESCRIPTION

Overview

Figure 8A:
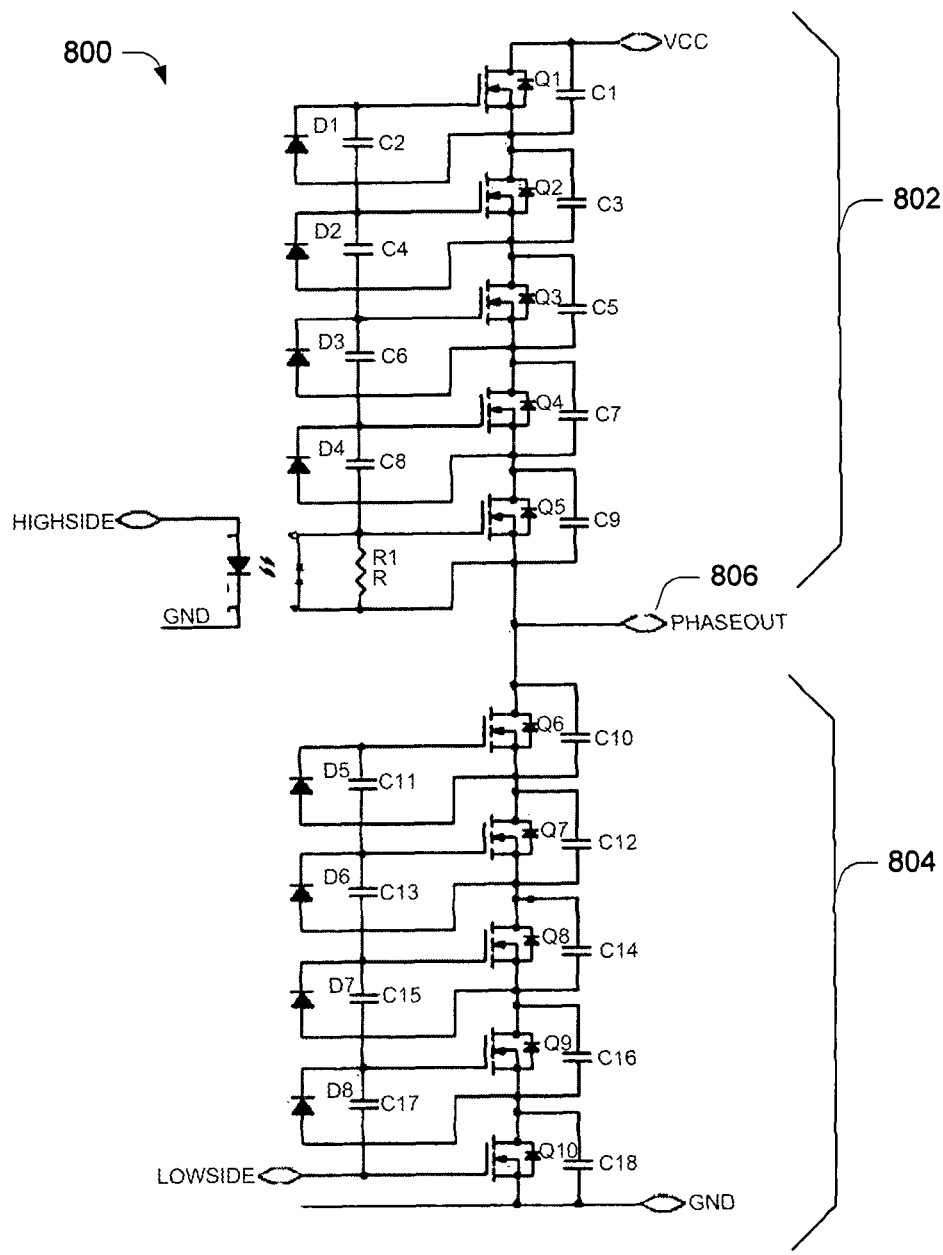
FIG. 8a is a circuit diagram in accordance with one or more embodiments.

Various embodiments provide keyboards that utilize an electrically-deformable material as an actuating mechanism to provide haptic feedback to a user of the keyboard. Haptic feedback refers to feedback that is provided through movement related to touch.

In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least one embodiment, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

In the discussion that follows, a section entitled "Example Key or Keyboard Element" is provided and describes but one example of a key or keyboard element in accordance with one or more embodiments. Following this, a section entitled "Magnetically-Induced Snapover Effect" is provided and describes one example of how snapover effect can be achieved using a magnetic assembly. Following this, a section entitled "Drive Circuit" is provided and describes an example circuit that can be used as drive circuitry. Next, a section entitled "Detent Structure" is provided and describes an example detent structure that can be utilized to provide a snapover effect. A section entitled "Example System" is provided and describes a system that can be used in accordance with one or more embodiments. Next, a section entitled "Logical Key Groupings" is provided and describes how multiple different keys can be grouped together in accordance with one or more embodiments. Lastly, a section entitled "Example Method" is provided and describes a method in accordance with one or more embodiments.

Example Key or Keyboard Element

FIG. 1 illustrates an example key or keyboard element in accordance with one or more embodiments generally at 100. In this example, the key or keyboard element includes a frame 102 to which is mounted or otherwise connected to one or more sections of electrically-deformable material 104. Frame 102 is supported by an overall housing an example of which is provided below in FIG. 11. In the illustrative example, electrically-deformable material 104 comprises a single integral piece of material. It is to be appreciated and understood, however, that individual keys or keyboard elements can have multiple different sections of electrically-deformable material.

In at least some embodiments, the electrically-deformable material comprises an electro-active polymer or EAP. EAP refers to a class of polymers which are formulated to exhibit different physical, electrical, and/or electro-optical behaviors and properties. In general, when EAP is driven by an applied voltage, the EAP undergoes a deformation in a particular direction. This deformation causes the EAP to move in the particular direction. In this particular embodiment, the electrically-deformable material 104 is driven by one or more drive voltages to effect movement of an associated key or keyboard element. To this end, and in this embodiment, key or keyboard element 100 includes a center actuator 106 which is mounted to or otherwise joined with electrically-deformable material 104. Actuator 106, in turn, is fixedly connected to an associated key or keyboard element (not shown) which lies above the plane of the page upon which FIG. 1 appears.

Key or keyboard element 100 also includes one or more electrical contacts which are used to apply a drive voltage to electrically-deformable material 104. In the illustrated and described embodiment, first and second electrical contacts 108, 110 are provided and are in electrical communication with the electrically-deformable material 104. In turn, the first and second electrical contacts 108, 110 are connected with drive electronics which are used to apply a voltage to the contact and hence, cause deformation of the electrically-deformable material 104. Any suitable material can be used for contacts 108, 110. In the illustrated and described embodiment, the electrical contacts comprise a carbon material which is mounted to or otherwise joined with the electrically-deformable material.

FIG. 2 illustrates key or keyboard element 100 of FIG. 1 in a view that is taken along line 2-2 in FIG. 1. Like numerals from the FIG. 1 illustration have been utilized to depict like components. Here, the key or keyboard element 100 includes a user-engageable portion 202 which is the portion that is typically depressed by the user.

The user-engageable portion may, for example, correspond to a particular key, such as the letter "A" key, a function key, a shift key, and the like. The user-engagable portion includes a surface—here a top surface—that is typically engaged by a user's finger.

In addition, key or keyboard element 100 includes a pair of switch closure elements 204, 206 forming a switch. The switch closure elements can be formed from any suitable material examples of which include non-tactile membranes that include electrically conductive materials. Other materials include, by way of example and not limitation, conductive elastomeric material, carbon material, piezo-membrane, capacitive sensing, capacitive sensing in combination with piezo sensing and piezo ink, to name just a few. In addition, the switch closure elements can be located at any suitable location within the keyboard element. For example, the switch closure elements can be located between portion 202 and underlying structure, on top of portion 202, or any other suitable location. The switch closure elements are connected to circuitry to detect switch closure.

In addition, in at least some embodiments, backlighting can be provided by virtue of one or more light sources mounted underneath the key or keyboard element. The light sources can be implemented using any suitable technology. By way of example and not limitation, light sources can be implemented using LEDs, light pipes using LEDs, fiber optic mats, and/or electroluminescent panels to name just a few.

In at least some embodiments, the electrically deformable material is generally translucent, thus allowing light to pass through and illuminate the undersides of the keys. This can allow, for example, key legends to be illuminated for the user. In the past, backlighting keyboards has proven difficult due to the presence of various actuation structures such as domes and scissor mechanisms which tend to block light.

Referring to FIG. 3, when a user depresses key or keyboard element 100 in the direction shown, switch closure elements 204, 206 are brought into electrical communication (as indicated by the dashed oval) which closes a circuit thus indicating that a key or keyboard element has been depressed. Circuitry described below detects the depression event and causes drive electronics to apply one or more drive voltages (e.g., 500-5000 volts) to the electrically-deformable material 104. The drive electronics can be configured in any suitable way. For example, in some embodiments, the drive circuitry can include switching circuitry that switches a low voltage side of a power supply on or off using, for example, one power supply per key or keyboard element. Inductive transformers or piezoelectric transformers can be used to generate sufficient voltage supplies, as will be appreciated by the skilled artisan. Alternately or additionally, various solid state devices can be used to switch power from a single voltage supply to individual EAP portions as required. One specific example of a circuit suitable for use is shown and described below in a section entitled "Drive Circuit". Alternately or additionally, switching can be achieved using an application specific integrated circuit (ASIC) that contains a series array of solid state switch elements.

When the drive voltages are applied to the electrically-deformable material, multi-vectored movement is imparted to actuator 106 and hence, to portion 202.

Specifically, and as perhaps best shown in FIGS. 4 and 5, when a user depresses a key or a keyboard element sufficient to effect switch closure, the drive electronics drive the electrically-deformable material and hence, the key or keyboard element in a first direction which, in this example, is generally toward the user. In this example, the drive voltage is applied through electrical contact 110. Subsequently, the drive electronics, through electrical contact 108, drive the electrically-deformable material in a second, different direction. In this example, the second, different direction is generally away from the user. In at least some embodiments, the first direction moves actuator 106 a first distance and a second direction moves actuator 106 a second distance which is greater than the first distance. In at least some embodiments, the first distance is about half the distance of the second distance. In at least some embodiments, the first distance is about ½ millimeter and a second distance is about 1 mm.

The electrically-deformable material can, however, be operated in a "single phase" mode or a "dual phase" mode. In a single phase mode, when the material is electrically driven, the material moves the key or keyboard element in a desired direction. When the drive voltage is removed, the material returns to its original, starting position due to the resiliency of the material. In a dual phase mode, the material is driven as described above. Of course, multiple other phases can be used by driving the material to impart to it movements other than the "back and forth" movement described above.

Magnetically-Induced Snapover Effect

In at least some embodiments, movement of the key or keyboard element to provide a snapover effect is provided through a combination of the electrically-deformable material and a magnetic assembly comprising, in this example, a pair of opposed magnets that are mounted in the key or keyboard element structure.

As an example, consider FIG. 6. There, a key or keyboard element is shown generally at 600. Like numerals from the above-described embodiments are utilized to depict like components. Here, a magnet assembly 602 includes a first magnet 604 and a second magnet 606. First magnet 604 is seated or otherwise fixedly mounted to user-engageable portion 202. Second magnet 606 is mounted to electrically-deformable material 104. When a user depresses a key or keyboard element, a drive voltage is applied to the electrically-deformable material 104 sufficient to cause second magnet 606 to move in the direction indicated. In this example, the drive voltage is applied first by electrical contact 108. As the second magnet 606 moves in the indicated direction, the interaction of the magnetic fields of magnets 604, 606 causes magnet 604 to be driven in an opposite direction as indicated in FIG. 7. As first magnet 604 is driven under the influence of the magnets' magnetic fields, user-engageable portion 202 is moved in a first direction, as shown in FIG. 7. A second drive voltage is then applied by electrical contact 110 to cause second magnet 606 to be moved in the opposite direction as shown in FIG. 8. Again, this causes the magnetic fields of the magnet assembly to interact with one another and move the key or keyboard element back to what can be considered a starting location or equilibrium point.

Drive Circuit

FIG. 8a illustrates an example drive circuit in accordance with one embodiment, generally at 800. Here, there is a high side stack 802 and a low side stack 804. A supply voltage is connected across the stacks to ground. A phaseout node 806 is provided between the high side stack 802 and the low side stack 804.

Individual stacks are defined by collections of series-connected field effect transistors (FETs) individual ones of which are connected in parallel with a capacitive element or capacitor as shown. The parallel-connected capacitors reduce static power consumption. During a switching transient, the parallel capacitors equally share the voltage drop across the stack so that the sharing is even at the end of the dynamic mode.

Since there is no static current draw, there is no charge depletion to offset the balance. Of course there is always leakage in the capacitors and capacitive actuator that would be considered static current draw, but the FETs themselves have enough drain-source leakage that the leakage of the capacitors and load are offset and the system remains stable with a fast response. The leakage of the FETs is enough to maintain the static voltage sharing but since it is on the order of nanoamps there is an acceptable level of power dissipation, even for many stacks of devices in parallel.

As a design consideration, when driving capacitive loads, the dynamic load balancing is affected by the load charging time constant, causing the FET nearest the output to carry too little voltage which can make the other FETS fail due to exceeding their drain-source voltage rating when operating at high voltages close to the maximum rating of the stack. This happens as the stack turns on because the charge of capacitive load is lagging and therefore drawing as much charge from the neighboring nodes as possible. This charge depletion offsets the balance across the FETs since the resistance of the switching devices limits the current flow to the output. However, adding a capacitor across the nearest FET to the output (on the order of 1:50 actuator to added capacitor) solves the problem for these devices and switch speed since the capacitors will not let voltages change as quickly. When combining this corrective factor and the already existing parallel capacitors, all the capacitors in parallel with the FETs are the same value in order to keep the voltage sharing equal across the devices.

Detent Structure

Figure 9:
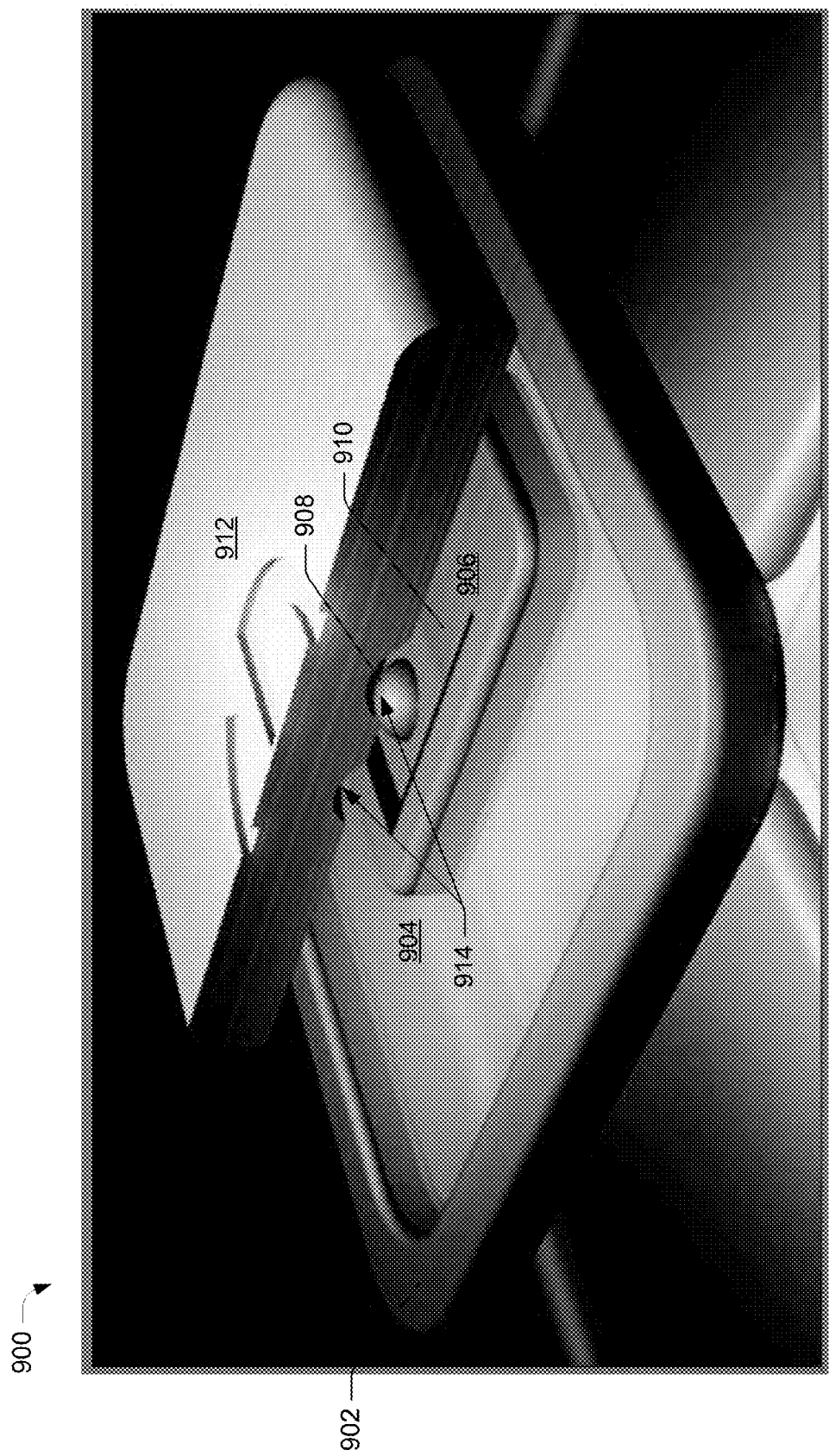
FIG. 9 illustrates a key or keyboard element in accordance with one or more embodiments.

In at least some embodiments, a detent structure can be utilized to impart a snapover effect when the user depresses a key or keyboard element. Any suitable detent structure can be utilized. As an example, consider FIG. 9.

There, a key or keyboard element is shown generally at 900. A frame 902 supports electrically-deformable material 904. A detent structure 906 includes a knob 908 which is supported by a flange 910 which acts as a spring. User-engageable portion 912 includes a pair of concave indentations 914. In this example, when the electrically-deformable material is driven by a voltage, it moves detent structure 906 causing knob 908 to ride into and out of the concave indentations 914 underneath the user-engageable portion 912. As engagement and disengagement occurs between knob 908 and the concave indentations 914, a change in velocity takes place which is translated to the top surface of user-engageable portion 912. This, in turn, provides haptic tactile feedback to a user's finger.

Example System

Figure 10:
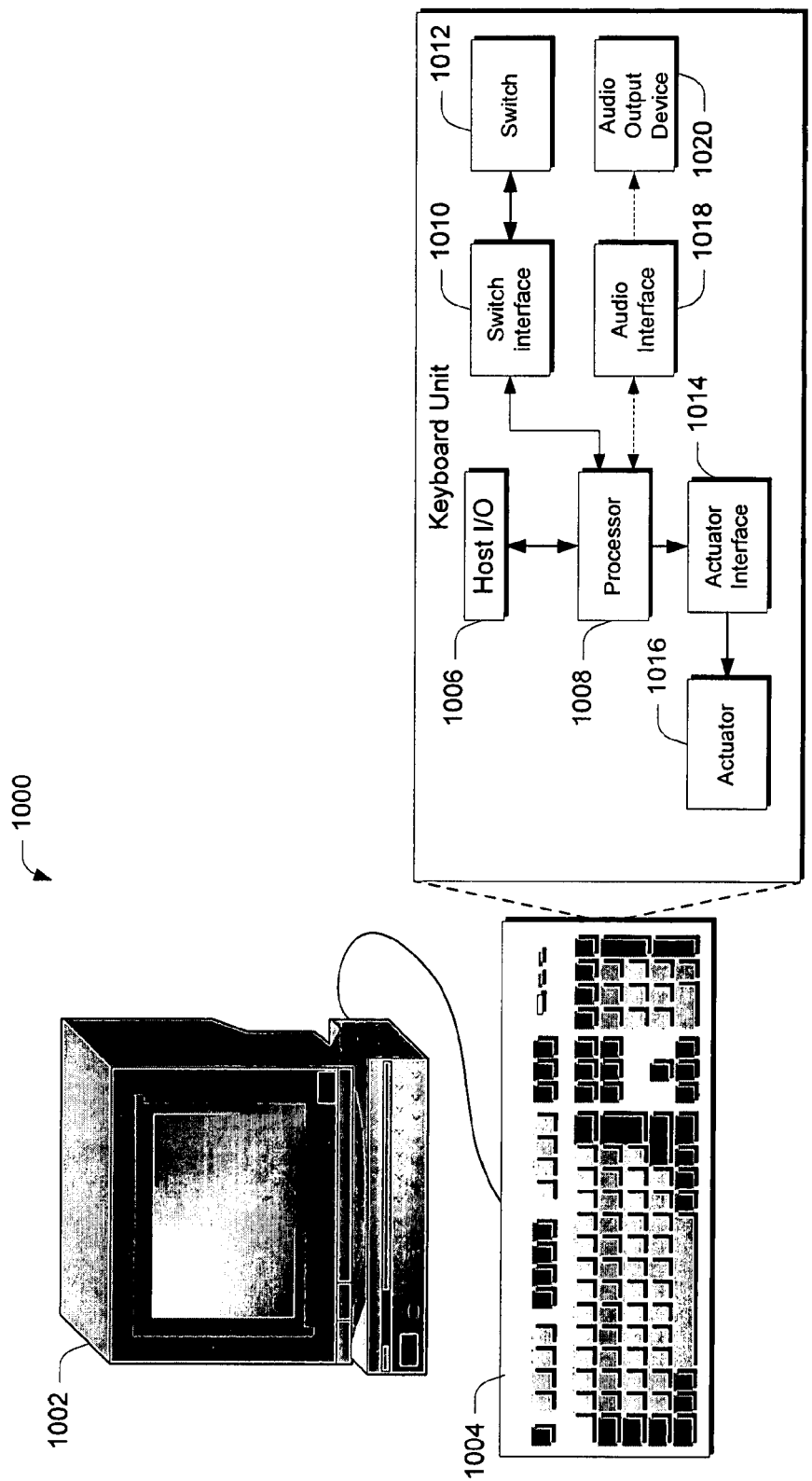
FIG. 10 illustrates a system in accordance with one or more embodiments.

FIG. 10 illustrates an example system in accordance with one embodiment generally at 1000. System 1000 includes, in this example, a computing device 1002 and a keyboard unit 1004. Computing device 1002 can include any suitable computing device such as a desktop computing device, laptop computer, notebook computer and the like.

Keyboard unit 1004 includes, in this example, a host input/output module 1006 which enables communication between computing device 1002 and keyboard unit 1004. Any suitable module can be used examples of which include, by way of example and not limitation, Universal Serial Bus (USB) modules, Bluetooth modules, RS232, PS2, CAN, TCPIP, and the like. Keyboard unit 1004 further includes a microprocessor 1008, a switch interface 1010, a switch 1012, an actuator interface 1014, an actuator 1016, and, optionally, an audio interface 1018 and an audio output device 1020. These various components can be implemented in connection with any suitable hardware, software, firmware or combination thereof. In at least some embodiments, components of the keyboard unit can be implemented as an application specific integrated circuit or ASIC.

In operation, switch 1012 is configured to sense when a particular key or keyboard element is depressed. One example of such a switch is switch closure elements 204, 206 in FIG. 2. Of course, other switch arrangements can be utilized without departing from the spirit and scope of the claimed subject matter, examples of which are provided above. Switch interface 1010 notifies microprocessor 1008 when a depression event has occurred. Microprocessor 1008 controls actuator interface 1014, which can include the above-mentioned drive electronics, effective to cause the drive electronics to apply a drive voltage(s) to actuator 1016. Actuator interface 1014 can be implemented in connection with any suitable hardware, software, firmware, or combination thereof. In this example, actuator 1016 includes both the electrically-deformable material, as well as the physical structure that is mounted to a key or keyboard element.

As noted above, the drive electronics can be used to drive the electrically-deformable material in any suitable way to achieve any suitable movement. In at least some embodiments, the drive electronics are utilized to drive the electrically-deformable material in a manner that imparts multi-vectored movement to the material and hence, to the key or keyboard element with which it is associated. In a specific implementation, this multi-vectored movement comprises a first movement in a first direction, and then a second movement in a second different direction. Of course, other movements and various other directions can be used without departing from the spirit and scope of the claimed subject matter.

Optionally, keyboard unit 1004 can include an audio interface 1018 and an associated audio output device 1020. In at least some embodiments, audio interface 1018 is in communication with microprocessor 1008 and can be configured to produce sounds associated with key or keyboard element depression events. For example, in at least some embodiments, sound recordings of key depressions can be saved and used by the audio interface 1018 to produce, via audio output device 1020, a key depression sound when the key is depressed by the user.

Logical Key Groupings

In at least some embodiments, multiple keys or keyboard elements can be grouped together into a logical grouping which is driven in a multi-vectored manner to provide haptic feedback to a user. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

Figure 11:
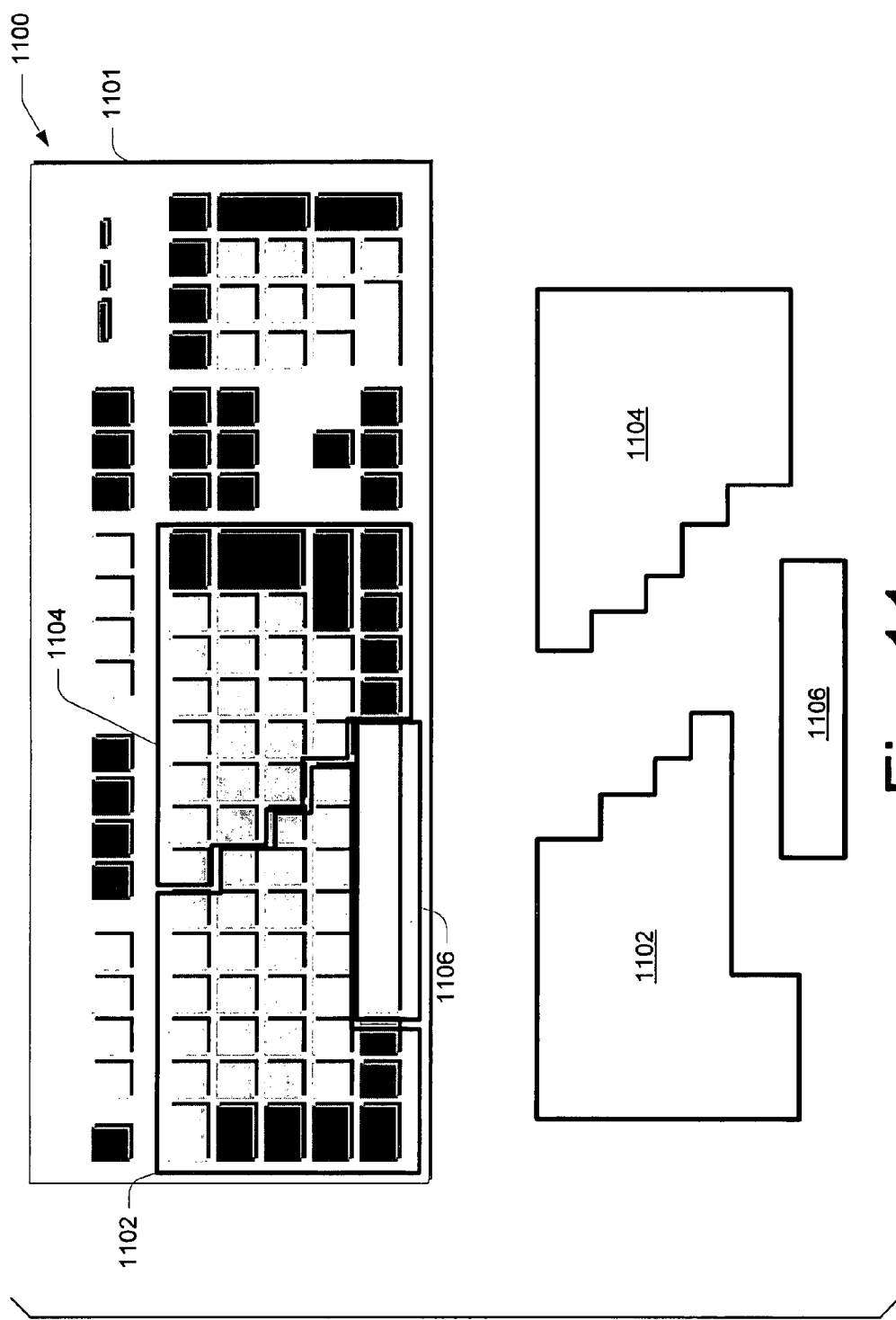
FIG. 11 illustrates an example keyboard in accordance with one or more embodiments.

As an example, consider FIG. 11. There, an example keyboard, in accordance with one or more embodiments, is shown generally at 1100. In this example, a keyboard housing 1101 contains or otherwise supports a plurality of keys. Some of the individual keys are grouped into two logical groupings 1102, 1104. These logical groupings define plates that are each moved in a multi-vectored manner as described above. In addition, a plate 1106 includes the space bar key and is separately driven by its own actuator. For clarity, the individual logical groupings are represented both superimposed on the illustrated keyboard and separately underneath the keyboard. It is to be appreciated and understood that in at least some embodiments, when individual keys or key groupings are moved, the overall housing that supports the keys is not moved. Effectively then, the systems described above can, in at least some embodiments, provide for discrete individual movement of keys or key groupings without moving the corresponding housing.

It is to be appreciated and understood that any suitable grouping of keys or keyboard elements can be used. In this particular example, the logical grouping of keys corresponds to those keys that are typically used by the right hand, and those keys that are typically used by the left hand. Of course, other logical key groupings can be used without departing from the spirit and scope of the claimed subject matter.

Example Method

FIG. 12 is a flow diagram that describes steps a method in accordance with one embodiment. The method can be implemented in connection with any suitable hardware, software, firmware or combination thereof. In at least some embodiments, the method can be implemented by a system, such as those systems shown and described above. It is to be appreciated and understood that the described method can be implemented by systems other than those described above without departing from the spirit and scope of the claimed subject matter.

Step 1200 presses a key or keyboard element. This step is typically performed by a user. Step 1202 detects an associated switch closure. In the illustrated and described embodiments, a switch associated with a depressed key is utilized to ascertain when the key has been depressed. One specific example of how this can be done is provided above. Of course, other ways of sensing or detecting a switch closure can be used without departing from the spirit and scope of the claimed subject matter.

Responsive to detecting a switch closure at 1202, step 1204 activates a first drive line for the associated key or key board element. In one or more embodiments, the drive line is connected to an electrically-deformable material as described above. Activating the first drive line causes the electrically-deformable material to deform and hence, move the associated key in a first direction. Step 1206 activates a second drive line for the associated key or keyboard element. Again, this drive line is connected to the electrically-deformable material as described above. Activating the second drive line causes the electrically-deformable material to deform and hence, move the associated key in a second different direction. In the example above, the first and second directions are generally opposite of one another. In addition, the direction of movement is generally orthogonal to the direction of force applied by the user to depress the key. In this manner, the electrically-deformable material can be electrically driven to impart a multi-vectored movement to the key or keyboard element. As pointed out above, however, other directions of movements can be used without departing from the spirit and scope of the claimed subject matter. For example, a particular key may be driven in three or more directions to impart a desired haptic response.

Various embodiments can enable keyboards to provide a desired haptic response, yet be designed to embody a smaller form factor than those typically designed using rubber dome technology. In accordance with one or more embodiments, form factors of the switch, EAP and keytop can be designed as follows. It is to be appreciated and understood that the described form factors constitutes examples of one embodiment. As such, other form factors can be used without departing from the spirit and scope of the claimed subject matter. The described form factors refer to the vertical thickness of the identified elements, for example, as viewed in FIG. 2.

|  | Upper (about) | Range (between about) | Implementation (about) |
| --- | --- | --- | --- |
| Switch | .50 mm | .0508 mm .50 mm | .2286 mm |
| EAP | 2.00 mm | .0175 mm-2.00 mm | 1.00 mm |
| Keytop | 1.50 mm | .254 mm-1.50 mm | .508 mm |
| Totals | 4.00 mm | .3223 mm-4.00 mm | 1.7366 mm |

CONCLUSION

Various embodiments provide keyboards that utilize an electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least some embodiments, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An assembly comprising:
    a user-engageable portion configured to operate as a keyboard element on a keyboard;
    a switch configured to close in response to a keypress at the user-engageable portion; and
    at least one electrical contact configured to cause an actuator that is mechanically or physically coupled to the user-engageable portion to move in response to the switch closing, the movement being in a direction that is generally orthogonal to a direction effective to cause the switch to close;
    wherein the actuator is coupled to an electrically-deformable material, the electrically deformable material responding to an electrical impulse provided by the at least one electrical contact to thereby cause the user-engageable portion to move in the direction that is generally orthogonal to the direction effective to cause the switch to close; and
    wherein the electrically-deformable material comprises a first magnet, the user-engageable portion has a second magnet, and the first magnet moves away from the second magnet when the electrically deformable material responds to the electrical impulse.

2. The assembly of claim 1, wherein the at least one electrical contact comprises a first and second electrical contact, the first electrical contact configured to cause the user-engageable portion to move in a first direction that is generally orthogonal to the direction effective to cause the switch to close, the second electrical contact configured to cause the user-engageable portion to move in a second direction that is generally orthogonal to the direction effective to cause the switch to close.

3. The assembly of claim 2, wherein the distances which the user engagable surface moves in the first and second directions that are generally orthogonal to the direction effective to cause the switch to close are different.

4. The assembly of claim 2, wherein the first direction that is generally orthogonal to the direction effective to cause the switch to close is generally in a direction opposite of the second direction that is generally orthogonal to the direction effective to cause the switch to close.

5. The assembly of claim 1, wherein the electrically-deformable material comprises an electro-active polymer.

6. The assembly of claim 1, wherein the electrically-deformable material is translucent, the assembly further comprising a lighting mechanism to light to provide light from one side of the user-engageable portion through the translucent electrically-deformable material to another side of the user-engageable portion.

7. An assembly comprising:
    a user-engageable portion configured to operate as a keyboard element on a keyboard, the user-engageable portion having a second magnet;
    a switch configured to close in response to a keypress at the user-engageable portion;
    an actuator having a first magnet; and
    at least one electrical contact configured to cause the actuator to move relative to the user-engageable portion in a direction that is generally orthogonal to a direction effective to cause the switch to close, the movement of the actuator providing haptic feedback at the user-engageable portion when the switch is closed;
    wherein either or both of the first and second magnets are moved in response to the switch closure.

8. The assembly of claim 7, wherein the at least one electrical contact comprises a first and second electrical contact, the first electrical contact configured to cause the actuator to move in a first direction that is generally orthogonal to the direction effective to cause the switch to close, the second electrical contact configured to cause the actuator to move in a second direction that is generally orthogonal to the direction effective to cause the switch to close.

9. The assembly of claim 8, wherein the distances which the actuator moves in the first and second directions that are generally orthogonal to the direction effective to cause the switch to close are different.

10. The assembly of claim 8, wherein the first direction that is generally orthogonal to the direction effective to cause the switch to close is in a generally opposite direction of the second direction that is generally orthogonal to the direction effective to cause the switch to close.

11. The assembly of claim 7, wherein the actuator is coupled to an electrically-deformable material, the electrically deformable material responding to an electrical impulse provided by the one or more contacts to thereby cause the actuator to move in a direction that is generally orthogonal to the direction effective to cause the switch to close.

12. The assembly of claim 11, wherein the electrically-deformable material comprises an electro-active polymer.

13. The assembly of claim 11, wherein the electrically-deformable material is translucent.

14. The assembly of claim 11, wherein the electrically-deformable material is configured to be driven in a single phase mode.

15. The assembly of claim 11, wherein the electrically-deformable material is configured to be driven in a dual phase mode.

16. The assembly of claim 11, wherein the electrically-deformable material comprises a first magnet, the user-engageable portion has a second magnet, and the first magnet moves away from the second magnet when the electrically deformable material responds to the electrical impulse.

17. The assembly of claim 7 wherein the actuator comprises a detent structure having a protruding knob and the user-engageable portion has a plurality of indents configured to accept the protruding knob, the assembly configured to impart a snapover effect when the user-engageable portion is depressed, the snapover effect generated from the actuator moving relative to the user-engageable portion thereby moving the knob from one indent to another.

18. A computer-implemented method comprising:
    receiving an input associated with a switch closure of a switch associated with a user-engageable portion of a keyboard key, the user-engageable portion having a second magnet;
    responsive to receiving said input, causing movement of the user engageable portion by deformation of an electrically-deformable material having a first magnet thereby moving an actuator relative to the user-engageable portion in a direction generally orthogonal to a direction effective to cause switch closure such that the first magnet moves away from the second magnet due to the deformation of the electrically deformable material.

* * * * *